United States Patent [19]
Bertagnolli et al.

[11] Patent Number: 5,213,670
[45] Date of Patent: May 25, 1993

[54] METHOD FOR MANUFACTURING A POLYCRYSTALLINE LAYER ON A SUBSTRATE

[75] Inventors: Emmerich Bertagnolli; Herbert Kabza, both of Munich, Fed. Rep. of Germany

[73] Assignee: Siemens Aktiengesellschaft, Munich, Fed. Rep. of Germany

[21] Appl. No.: 745,957

[22] Filed: Aug. 9, 1991

Related U.S. Application Data

[63] Continuation of Ser. No. 506,119, Apr. 9, 1990, abandoned.

[30] Foreign Application Priority Data

Jun. 30, 1989 [DE] Fed. Rep. of Germany ....... 3921627

[51] Int. Cl.⁵ .................... C23C 14/00; C23C 16/00
[52] U.S. Cl. .................. 204/192.25; 427/96; 427/99; 427/248.1; 427/379; 427/397.7
[58] Field of Search .......... 427/96, 248.1, 99, 397.7, 427/379; 204/192.25

[56] References Cited

U.S. PATENT DOCUMENTS

| | | | |
|---|---|---|---|
| 4,148,931 | 4/1979 | Reuschel | 427/248.1 |
| 4,151,058 | 4/1979 | Kaplan | 204/192.25 |
| 4,177,474 | 12/1979 | Ovshinsky | 204/192.25 |
| 4,179,528 | 12/1979 | Losee | 427/397.7 |
| 4,213,781 | 7/1980 | Noreika | 437/81 |
| 4,217,374 | 8/1980 | Ovshinsky | 427/248.1 |
| 4,322,452 | 3/1982 | Krausse | 427/99 |
| 4,357,179 | 11/1982 | Adams | 427/99 |
| 4,417,092 | 11/1983 | Moustakas | 204/192.25 |
| 4,441,973 | 4/1984 | Noguchi | 204/192.25 |
| 4,494,136 | 1/1985 | Perepezko | 357/65 |
| 4,508,609 | 4/1985 | Moustakas | 204/192.25 |
| 4,529,617 | 7/1985 | Chenevas-Paule et al. | 427/53.1 |
| 4,597,989 | 7/1986 | Wonsowicz | 427/99 |
| 4,789,560 | 12/1988 | Yen | 427/99 |
| 4,963,506 | 10/1990 | Liaw | 427/248.1 |

FOREIGN PATENT DOCUMENTS

| | | | |
|---|---|---|---|
| 2430859 | 1/1975 | Fed. Rep. of Germany | 427/99 |
| 166027 | 10/1982 | Japan | 204/192.25 |
| 246283 | 12/1985 | Japan | 427/96 |
| 1026780 | 2/1986 | Japan | 427/248.1 |

OTHER PUBLICATIONS

T. I. Kamins "Structure and Properties of LPCVD Silicon Films" J. Electrochem. Soc. vol. 12. No. 3 Mar. 1980. pp. 686–690.

R. Bisaro et al. "Solid-Phase Cuptallization Kinetics in Doped α-Si Chemical Vapor Deposition Films" Physical Review B vol. 31, No. 6. Mar. 1985, p. 3568–3575.

K. Zellama et al. "Cuptallization in Amorphous Silicon" J. Appl. Phys. 50(11) Nov. 1979, pp. 6995–7000.

Kinsborn et al., "Crystallization of Amorphous Silicon Films During Low Pressure Chemical Vapor Deposition" *Appl. Phys. Lett.*, vol. 42, No. 9, May 1, 1983, pp. 835–837.

(List continue on next page.)

[57] ABSTRACT

A manufacturing method for polycrystalline silicon layers with a defined particle size and texture on a substrate provides for depositing of an amorphous silicon layer on the substrate. The substrate with the amorphous silicon layer is placed into a furnace at an initial temperature lower than the crystallization temperature of amorphous silicon. After an adjustment to thermal equilibrium, the furnace is heated in a controlled fashion from the initial temperature to a target temperature which is higher than the crystallization temperature, whereby the amorphous silicon layer is completely crystallized and becomes a polycrystalline layer. The method is particularly applicable in manufacturing polycrystalline silicon resistances for integrated circuits.

27 Claims, 1 Drawing Sheet

OTHER PUBLICATIONS

McGinn et al., "The Effects of Deposition Temperature and Rate Upon the Structure of LPCVD Silicon", ECS Meeting (May 1983), pp. 647-648.

Becker et al., "Low resistance polycrystalline silicon by boron or arsenic implantation and thermal crystallization of amorphously deposited films", *J. Appl. Phys.*, vol. 56, No. 4, Aug. 15, 1984, pp. 1233-1236.

Squeland et al, "Crystallization of phosphorus-doped amorphous silicon films prepared by glow discharge decomposition of silane", *Revue Phys. Appl.*, vol. 16, Dec. 1981, pp. 657-662.

Böhm et al., "Formation of Very Shallow Junctions in Poly-SI Emitter Self-Aligned Bipolar Transistors Using Rapid Optical Annealing", *Proceeding of 1st Int. Symp of ULSI Science and Technology 1987*, Philadelphia, May 1987, pp. 347-357.

Harbeke et al., "High Quality Polysilicon by Amorphous LPCVD Growth", ECS Meeting, May 1983, p. 649.

Wada et al., "Grain Growth Mechanism of Heavily Phosphorus-Implanted Polycrystalline Silicon", *J. Electrochem Soc.*, vol. 125, No. 9, Sep. 1978, pp. 1499-1504.

Kavanagh et al., "The Polycrystalline-Si Contact to GaAs", *J. Electrochem Soc.*, vol. 133, No. 6 Jun. 1986, pp. 1176-1179.

*Primary Examiner*—Shrive Beck
*Assistant Examiner*—Vi Duong Dang
*Attorney, Agent, or Firm*—Hill, Steadman & Simpson

METHOD FOR MANUFACTURING A POLYCRYSTALLINE LAYER ON A SUBSTRATE

This is a continuation of application Ser. No. 07/506,119 filed Apr. 9, 1990, abandoned.

BACKGROUND OF THE INVENTION

1. Field of the Invention

The present invention relates generally to a method for manufacturing a polycrystalline layer on a substrate, and in particular, to a method for manufacturing a polycrystalline layer of a defined grain size and texture.

2. Description of the Related Art

In semiconductor technology, polycrystalline silicon layers, can be applied in many different ways. Polycrystalline silicon layers are necessary for resistors composed of polycrystalline silicon in integrated circuits, for solar cells, and for silicon-on-Insulator (SOI) technology.

The application of resistances composed of polycrystalline silicon, also known as so-called poly-silicon resistances, on integrated circuits requires reliable realization of the target parameters of the resistances. The parameters are determined by the conditions during deposition, which affect crystallinity and thickness, the implantation dosage or doping agent concentration, and the activation of the doping agent. The implantation dosage and the activation thereby determines the concentration of the chemically dissolved and electrically active doping agents. The selection of deposition conditions determines the crystallinity of the silicon layer. For instance see the references T. I. Kamins, J. Electrochem. Soc., Vol. 127, No. 3, March 1980, pp. 686–690; E. Kinsbron et al, Appl. Phys. Lett. Vol. 42, No. 9, 1 May 1983, pp. 835–837; J. T. McGinn et al, ECS-meeting (May 1983) pp. 647–648; F. S. Becker et al, Appl. Phys. Lett. Vol. 56, No. 4, 15 Aug. 1984, pp. 1233–1236.

One possibility for manufacturing polycrystalline silicon layers is polycrystalline deposition. The grain structure and the texture are determined by the deposition process itself in this case. The following high temperature steps which are in the range of 800° C. to 1050° C. do not significantly alter the crystallinity of the silicon layers. This is particularly true for undoped layers and layers which are doped with boron, for example. On the other hand, phosphorous or arsenic doping results in further grain growth in the polycrystalline layer, however, the reproduceability thereof depends upon the starting conditions of the deposition.

Another possibility for manufacturing polycrystalline silicon layers is that the layer is first deposited in an amorphous mode and is subsequently transformed to a polycrystalline layer via crystallization during a high temperature step. The grain structure and the texture of such layers are determined by the crystallization during the high temperature step. Post-tempering or annealing at low temperatures does not alter the crystallization once the grain structures have been determined. Layers deposited in an amorphous mode which are subsequently crystallized only have approximately ⅓ of the layer resistance of layers that are deposited in a polycrystalline fashion given otherwise equal parameters. For example, see F. S. Becker et al., Appl. Phys. Lett. Vol. 56, No. 4, 15 Aug. 15, 1984, pp. 1233–1236.

Layers deposited in an amorphous mode can thus reach the same target values of resistance with significantly thinner layers. Thus, layers deposited amorphously are an essential means to reduce problems of topography in integrated circuits. One disadvantage, however, of amorphously deposited layers is that extremely great fluctuations in the resulting resistance values of at least ±10% result as compared to layers which are deposited in a polycrystalline fashion which have a maximum fluctuation range of ±2%.

Therefore, the advantages of amorphously deposited layers can only be used adequately in sub-regions of silicon-micro electronic circuits where precisely adjusted resistant values for the resistance layers are not crucial.

It is known, for example from the reference F. S. Becker et al, Appl. Phys. Lett. Vol. 56, No. 4, 15 Aug. 1984, pp. 1233–1236, that the layer resistance and other electrical features of polycrystalline silicon layers are in correlation with the grain structure and the texture of the layer.

SUMMARY OF THE INVENTION

Therefore, in light of the problem described hereinabove, it is an object of the present invention to provide a manufacturing method for polycrystalline silicon layers of a defined grain size and texture without losing the advantages of amorphously deposited layers.

According to the present invention, the problems of the prior art are solved by a manufacturing method for polycrystalline silicon layers on a substrate having the following steps:

a) depositing an amorphous silicon layer on a substrate;

b) putting the substrate with the amorphous silicon layer into a furnace in which an initial temperature condition prevails, which is lower than the crystallization temperature of amorphous silicon and holding the substrate with the amorphous silicon layer at the initial temperature to reach a thermal equilibrium at the initial temperature;

c) after thermal equilibrium is reached, the substrate with the amorphous silicon layer is heated up in the furnace in a controlled manner from the initial to a target temperature which is higher than the crystallization temperature, whereby the amorphous silicon layer is completely crystallized and becomes a polycrystalline silicon layer.

The present invention takes advantage of the perception that amorphous layers are thermodynamically metastabile. This means that the layers, upon being subject to energy above a certain threshold level, crystallize. The phase transition from amorphous material to crystalline material does not occur uniformly in the entire volume of the material but starts locally by generating small crystalline nuclei which then expand into the amorphous regions. The crystallization kinetics may be divided into two areas: first, nucleation and, second, crystallite growth.

From the references K. Zellama et al, J. Appl. Phys. Vol. 50, No. 11, November 1979, pp. 6995–7000; S. Squeland et al, Rev. Phys. Appl. 16 (1981) pp. 657–662; R. Bisaro et al. Phys. Rev B., Vol. 31, No. 6, 15 Mar. 1985, pp. 3568–3575, it is known that in the case of amorphous silicon layers which are manufactured by deposition from the gas phase using chemical vapor deposition (CVD), heterogeneous nucleation dominates, which basically takes place at the interface between the silicon and the substrate. The crystallization starts with a nucleation at the interface between the silicon and the substrate and the growth of a thin crystalline nuclei layer along the entire interface. After the generation of this nucleation layer, no further nucleation ensues. Only the growth of the crystallites take place at the cost of the amorphous layer. The growth direction proceeds perpendicularly to the layer plane. The crystallization ends as soon a the crystallization front has reached the top surface of the layer.

Since amorphous layers crystallize upon the supply of a sufficient amount of energy, the crystallization of amorphous layers which are inserted into a tube furnace preheated to, for example, 800° C., already takes place completely during the insertion event. The transition from amorphous material to crystalline material thereby ensues in an uncontrolled manner so that a reproducible adjustment of the grain structure and texture is not possible. This leads to the observed great fluctuations in the resulting layer resistances when the resistance layers are composed of polycrystalline silicon so manufactured.

The precise adjustment of layer resistance requires an exactly defined crystallization step.

In the method of the present invention, the crystallization ensues in an exactly defined crystallization step. Since the substrate with the amorphous silicon layer deposited thereon is inserted into a furnace that is preheated to an initial temperature which is lower than the crystallization temperature of the amorphous silicon, the amorphous silicon layer remains unaltered, in other words it remains in an amorphous state during the insertion event and during the adjustment of the thermal equilibrium in the furnace. After the thermal equilibrium has been adjusted, in other words after the amorphous silicon layer and the substrate have reached the initial temperature of the furnace, the furnace is heated up in a controlled fashion from the initial temperature to a target temperature which is higher than the crystallization temperature of the amorphous layer. During the controlled heating, the instantaneous temperature runs through a prescribed temperature profile which is reproducible. Quick as well as slow traversal through the temperature profile lead to reproducible texture and grain size in the crystallized layer. For slow traversal through the temperature profile, bigger crystallites are generated; whereas a quick traversal through the temperature profile results in smaller crystallites being generated.

The electrical resistance of the crystallized samples depends upon the size of the crystallites. Smaller crystallites mean a higher resistance while larger crystallites provide a lower resistance. Depending upon the field of application of the polycrystalline layer, various crystallite sizes and thus various electrical parameters are achieved due to the different speed in proceeding through the temperature profile.

The manufacturing method of the invention is suitable for all polycrystalline layers where a defined grain size and texture are crucial, and particularly for resistance layers composed of polycrystalline silicon, terminals composed of polycrystalline silicon electrical connections composed of polycrystalline silicon, silicon on insulator (SOI) technology, and for solar cells.

According to a preferred development of the present invention, the substrate is tempered at a target temperature, for example, 15 min.

One option for the manufacturing method of the invention is that an amorphous silicon layer is deposited using a chemical vapor deposition (CVD) method from the gas phase at approximately 560° C. In this case, the initial temperature in the furnace is in a range of approximately 500° to 550° C.

Another option for the present manufacturing method is that an amorphous silicon layer is deposited on a substrate using sputtering at a temperature of between approximately 200° to 350° C. In this case, the initial temperature of the furnace is correspondingly 200° to 350° C.

A slow heating of the substrate having the amorphous silicon layer to a target temperature of approximately 700° C. with a temporal change of temperature of less than or equal to 10° C. per minute produces grain sizes of approximately 0.3 micrometers given a layer thickness of 0.3 micrometers. Such polycrystalline silicon layers are suitable after a corresponding doping step, for the manufacturing of resistances composed of polycrystalline silicon.

The present invention also suggests performing the crystallization in a rapid thermal annealing step using a so called rapid-thermal-annealing process. In the rapid-thermal-annealing processes, quick temperature changes of at least 100° C. per second are generated. Typically, the temperature changes lie in the range of some 100° C. per second. These methods use, for example, tungsten lamps and water-cooled arc lamps for heating. Such rapid thermal annealing achieves temperatures in the range of between 500° and 1150° C.

Depending upon the desired electrical conductivity, the polycrystalline silicon layer is doped. The doping step ensues either via implantation into the polycrystalline silicon layer and via subsequent activation of the doping agents, or via implantation into the amorphous silicon layer before the crystallization step. In amorphous layers, the channeling effect which leads to smudged doping profiles basically does not occur. It is, therefore, advantageous to provide the implantation of boron, for example, into the amorphous layer before the crystallization step. In this case, the activation of the doping agent ensues at a high temperature step after the crystallization step.

Another possibility is to apply a doping agent in-situ during the amorphous deposition step.

Further embodiments of the invention include annealing the substrate at the target temperature, and in particular annealing the substrate at the target temperature for period of 15 minutes. In one embodiment, the amorphous silicon layer is deposited using a chemical vapor deposition (CVD) method at 560° to 600° C. and the initial temperature to which the substrate is heated is in the range of 500° to 550° C. Alternately, the amorphous silicon layer may be deposited by sputtering. In each of these embodiments, the target temperature to which the substrate and silicon layer are heated to achieve crystallization is in the range of 700° to 800° C. The heating from the initial temperature to the target temperature may ensue with a temporal change of temperature of less than or equal to 10° C. per minute. Alternately, the heating from the initial temperature to the target temperature may ensue by rapid thermal annealing with a temperature change of at least 100° C. per second. The present invention includes the possibility that the amorphous silicon layer is doped via implantation after it is deposited or that the silicon layer is doped via implantation after it has become polycrystalline. The further possibility of doping the amorphous silicon during the deposition process is also encompassed by the present invention. Where the layer has been doped, the doping agents may be activated in a high temperature step which is performed after the transformation of the amorphous silicon layer into a polycrystalline silicon layer.

The present invention provides particular utility in generating polysilicon resistances on integrated circuits.

DESCRIPTION OF THE PREFERRED EMBODIMENTS

Figure 1:
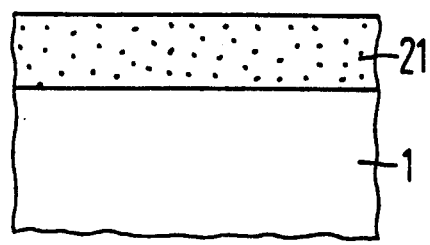
FIG. 1 is a cross section showing a substrate with an amorphous silicon layer.
Figure 2:
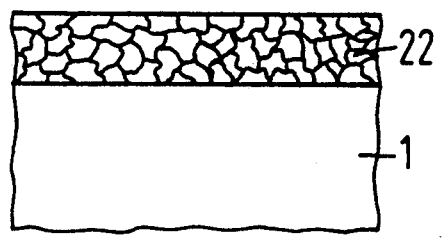
FIG. 2 is a cross section showing a substrate with a polycrystalline silicon layer.

In the following, FIGS. 1 and 2 serve to describe an exemplary embodiment of the invention. On a substrate 1, which is composed of silicon dioxide, an amorphous silicon layer 21 is deposited using, for example, a chemical vapor deposition method at 560° C. The amorphous silicon layer 21 is doped with a doping agent via implantation or in-situ doping. The doping agent is, for example, arsenic, if an n-resistance is desired, or boron, if a p-resistance is desired.

The substrate 1 with the amorphous silicon layer 21 is placed into a furnace which is preheated to an initial temperature. The initial temperature must be clearly below the crystallization temperature. If, for example, the amorphous silicon layer 21 is deposited on the substrate 1 at a temperature of 560° C. then it is advisable to select a temperature in the same range as the initial temperature. The initial temperature in the furnace is, for example, less than or equal to 560° C.

After the adjustment of the thermal equilibrium to the initial temperature, in other words, after the substrate 1 and the amorphous silicon layer 21 have been held at the initial temptterature for the necessary time for the substrate 1 and layer 21 to reach the initial temperature, then the furnace is changed from the initial temperature to a target temperature. The target temperature lies above the crystallization temperature of the silicon layer, for example at 700° C. The temperature change ensues corresponding to a predetermined temperature profile, for example having a change rate of less than or equal to 10° C. per minute. Using these parameters, the crystallite sizes are achieved which correspond to target parameters for resistance elements composed of polycrystalline silicon.

During the crystallization event, particle formation and subsequent crystallite growth take place at the border area between the substrate 1 and the amorphous silicon layer 21. Thus, a polycrystalline silicon layer 22 as shown in FIG. 2 develops from the amorphous silicon layer 21 of FIG. 1. The present invention also provides that the substrate may be tempered at the target temperature, for example for 15 minutes, to insure that the crystallization event is completely finished.

After the end of the tempering cycle, the doping agents are activated by a high temperature step. A suitable high temperature step is, for example, a furnace process at 900° C. for 8 minutes or a rapid thermal annealing method (RTA) at 1050° C. for 10 seconds. Since rapid thermal annealing steps lead to a very high electrical activation degree, as disclosed by H. J. Boehm et al in Proceedings of the 1st Int. Symp. on ULSI Science and Technology 1987, pp. 347-357, May 1987, Philadelphia, such rapid annealing steps are preferred over the furnace processes.

Figure 3:
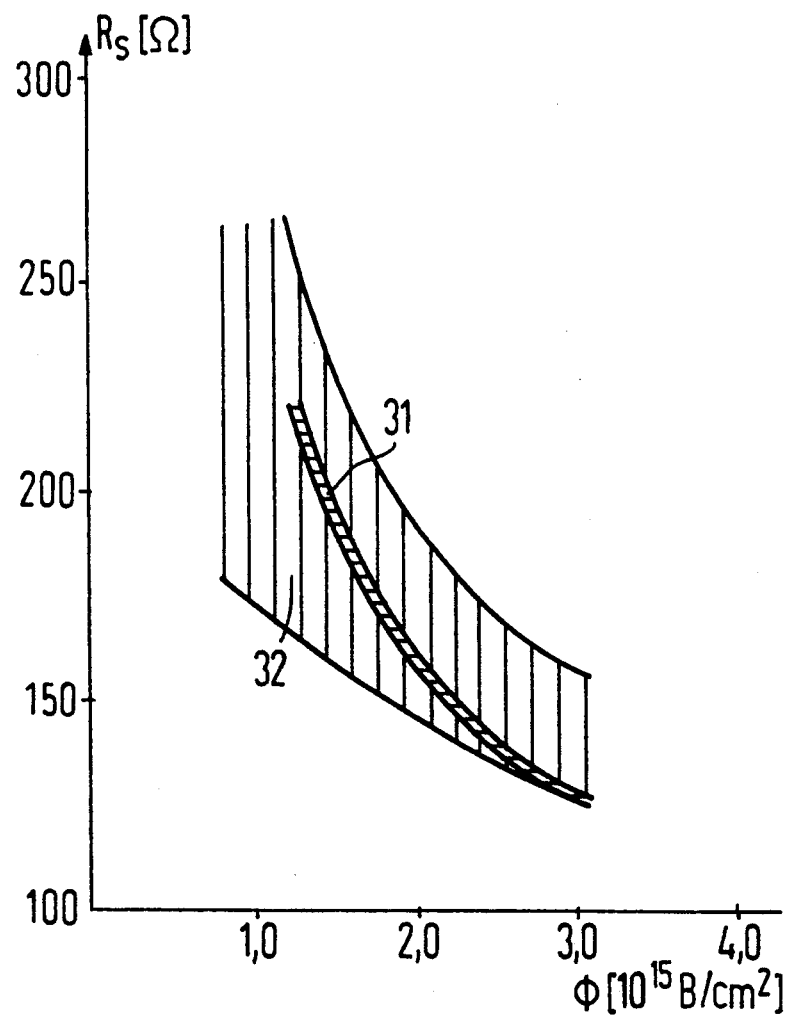
FIG. 3 is a graph of layer resistance dependent upon implantation dose for variously treated polysilicon.

FIG. 3 shows a graph of layer resistance $R_s$ dependent upon the implantation dose $\phi$ for various polysilicon resistance. A first curve 31 indicates the location of the layer resistances of the implantation dose of polycrystalline silicon resistances which were manufactured according to the method of the invention. The amorphous silicon layer was thereby deposited at 560° C. The initial temperature for the crystallization process in this example is 450° C., and the target temperature in the furnace is 800° C. The electrical activation of the doping agents occurred at 950° C.

FIG. 3 also shows a curve 32 illustrating the location of the layer resistances as a function of the implantation dose for polysilicon resistances generated according to the conventional method. These polysilicon resistances were deposited as amorphous silicon layers which, during the electrical activation, are crystallized in an uncontrolled manner.

A comparison of the first curve 31 and the second curve 32 show clearly that the range of the layer resistance values is drastically reduced by the manufacturing method of the invention. FIG. 3 also shows that an exact adjustment of the layer resistance of a polysilicon resistance manufactured according to a conventional method is impossible.

Thus, there has been shown and described a method for polycrystalline silicon layers achieving a defined particle size and texture which is particularly useful in the manufacture of polycrystalline silicon resistances on integrated circuits.

Although other modifications and changes may be suggested by those skilled in the art, it is the intention of the inventors to embody within the patent warranted hereon all changes and modifications as reasonably and properly come within the scope of their contribution to the art.

We claim:

1. A method for the manufacture of a polycrystalline silicon layer on a substrate, comprising the steps of:
   depositing an amorphous silicon layer on a substrate; and
   then controlling the phase transformation of the amorphous silicon into a polycrystalline layer by the steps of:
   heating said substrate with said amorphous silicon layer to an initial temperature that is lower than a crystalline temperature for the amorphous silicon,
   holding the substrate with said amorphous silicon layer at the initial temperature to achieve a thermal equilibrium of the substrate with the amorphous silicon layer at said initial temperature, and then, after reaching the thermal equilibrium, continuing the heating of said substrate with said amorphous silicon layer to raise the temperature at a controlled rate through a reproducible prescribed temperature profile from said initial temperature to a target temperature, said target temperature being higher than the crystallization temperature of said amorphous silicon so that said amorphous silicon crystallizes and becomes a polycrystalline layer having a defined grain size and texture.

2. A method as claimed in claim 1, further comprising the step of:

tempering said substrate substantially at said target temperature.

3. A method as claimed in claim 2, wherein said step of tempering said substrate substantially at said target temperature is conducted for at least 15 minutes.

4. A method as claimed in claim 1, wherein said step of depositing of said amorphous silicon layer utilizes a CVD (chemical vapor deposition) process at a temperature range of approximately 560° C. to 600° C., and
wherein said initial temperature is in a range of approximately 500° C. to 550° C.

5. A method as claimed in claim 1, wherein said step of depositing of said amorphous silicon layer is by sputtering.

6. A method as claimed in claim 1, wherein said target temperature is in a range of approximately 700° C. to 800° C.

7. A method as claimed in claim 1, wherein said step of controlled heating from said initial temperature to said target temperature is carried out with a controlled rate of no more than 10° C. change in temperature per minute.

8. A method as claimed in claim 1, wherein said step of controlled heating from said initial temperature to said target temperature is carried out by rapid thermal annealing using a controlled rate of at least 100° C. per second.

9. A method as claimed in claim 1, further comprising the step of:
doping said amorphous silicon layers via implantation of a doping agent after said step of depositing.

10. A method as claimed in claim 1, further comprising the step of:
doping said polycrystalline layer via implantation of a doping agent.

11. A method as claimed in claim 1, further comprising the step of:
doping said amorphous silicon layer in-situ during said step of depositing.

12. A method as claimed in claim 9, further comprising the step of:
activating said doping agent by heating to a high temperature after said transformation of said amorphous silicon layer into said polycrystalline layer in said step of controlled heating.

13. A method as claimed in claim 10, further comprising the step of:
activating said doping agent by heating to a high temperature after transformation of said amorphous silicon layer into said polycrystalline layer in said step of controlled heating.

14. A method as claimed in claim 11, further comprising the step of:
activating said doping agent by heating to a high temperature after transformation of said amorphous silicon layer into said polycrystalline layer in said step of controlled heating.

15. A method as claimed in claim 1, wherein said polysilicon layer is a polysilicon resistance layer on an integrated circuit.

16. A method for the manufacture of a polycrystalline silicon layer on a substrate, comprising the steps of:
depositing an amorphous silicon layer on a substrate;
heating said substrate with said amorphous silicon layer to an initial temperature that is lower than a crystallization temperature for the amorphous silicon;
holding the substrate with said amorphous silicon layer at the initial temperature to achieve a thermal equilibrium of the substrate with the amorphous silicon layer at said initial temperature; and then
heating of said substrate with said amorphous silicon layer to raise the temperature at a controlled rate of no more than 10° C. change in temperature per minute from said initial temperature to a target temperature, said target temperature being higher than the crystallization temperature of said amorphous silicon so that said amorphous silicon crystallizes and becomes a polycrystalline layer having a defined grain size and texture.

17. A method according to claim 16, further comprising the step of tempering said substrate substantially at said target temperature.

18. A method according to claim 17, wherein said step of tempering is conducted for at least 15 minutes.

19. A method according to claim 16, wherein said step of depositing of said amorphous silicon layer utilizes a chemical vapor deposition process at a temperature range of approximately 560° C. to 600° C., and wherein said initial temperature is in a range of approximately 500° C. to 550° C.

20. A method according to claim 10, wherein said step of depositing of said amorphous silicon layer is by sputtering.

21. A method according to claim 16, wherein said target temperature is in a range of approximately 700° C. to 800° C.

22. A method for the manufacture of a polycrystalline silicon layer on a substrate, comprising the steps of:
depositing an amorphous silicon layer on a substrate;
heating said substrate with said amorphous silicon layer to an initial temperature that is lower than a crystallization temperature for the amorphous silicon;
holding the substrate with said amorphous silicon layer at the initial temperature to achieve a thermal equilibrium of the substrate with the amorphous silicon layer at said initial temperature; and then
rapidly heating said substrate with said amorphous silicon layer to raise the temperature at a controlled rate of at least 100° C. per second from said initial temperature to a target temperature, said target temperature being higher than the crystallization temperature of said amorphous silicon so that said amorphous silicon crystallizes and becomes a polycrystalline layer having a defined grain size and texture.

23. A method according to claim 22, further comprising the step of tempering said substrate substantially at said target temperature.

24. A method according to claim 23, wherein said step of tempering is conducted for at least 15 minutes.

25. A method according to claim 21, wherein said step of depositing of said amorphous silicon layer utilizes a chemical vapor deposition process at a temperature range of approximately 560° C. to 600° C., and wherein said initial temperature is in a range of approximately 500° C. to 550° C.

26. A method according to claim 22, wherein said step of depositing of said amorphous silicon layer is by sputtering.

27. A method according to claim 22, wherein said target temperature is in a range of approximately 700° C. to 800° C.

* * * * *